United States Patent
Kato (10) Patent No.: US 9,267,840 B2
(45) Date of Patent: Feb. 23, 2016

(54) PHOTOELECTRIC CONVERSION APPARATUS THAT AMPLIFIES REFERENCE VOLTAGES CORRESPONDING TO PIXEL SIGNALS OF DIFFERENT COLORS AT DIFFERENT GAINS

(71) Applicant: CANON KABUSHIKI KAISHA, Tokyo (JP)

(72) Inventor: Satoshi Kato, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 153 days.

(21) Appl. No.: 13/891,911

(22) Filed: May 10, 2013

(65) Prior Publication Data

US 2013/0313413 A1    Nov. 28, 2013

(30) Foreign Application Priority Data

May 24, 2012  (JP) ................... 2012-118870

(51) Int. Cl.

| | |
|---|---|
| *H01L 27/00* | (2006.01) |
| *H03F 3/08* | (2006.01) |
| *H03G 3/20* | (2006.01) |
| *G01J 3/50* | (2006.01) |
| *G01J 1/44* | (2006.01) |
| *H04N 5/235* | (2006.01) |
| *H04N 5/335* | (2011.01) |
| *H04N 5/52* | (2006.01) |
| *H04N 5/21* | (2006.01) |
| *H04N 5/369* | (2011.01) |
| *H01L 27/146* | (2006.01) |
| *G01J 3/51* | (2006.01) |

(Continued)

(52) U.S. Cl.
CPC ................. *G01J 1/44* (2013.01); *G01J 1/0488* (2013.01); *G01J 1/46* (2013.01); *G01J 3/2803* (2013.01); *G01J 3/513* (2013.01); *H01L 27/14645* (2013.01); *H04N 5/21* (2013.01); *H04N 5/235* (2013.01); *H04N 5/335* (2013.01); *H04N 5/369* (2013.01); *H04N 5/52* (2013.01)

(58) Field of Classification Search
USPC ............ 250/208.1, 226, 214 R, 214.1, 214 A, 250/214 AG; 348/294–324; 257/414–470
See application file for complete search history.

(56) References Cited

U.S. PATENT DOCUMENTS

| | | | | |
|---|---|---|---|---|
| 4,642,682 | A | * | 2/1987 | Orsburn et al. ............... 358/520 |
| 4,736,241 | A | * | 4/1988 | Murakami ............ H04N 9/735 |
| | | | | 348/225.1 |

(Continued)

FOREIGN PATENT DOCUMENTS

JP   2010-199710 A   9/2010

*Primary Examiner* — Pascal M Bui Pho
(74) *Attorney, Agent, or Firm* — Fitzpatrick, Cella, Harper & Scinto (57) ABSTRACT

A photoelectric conversion apparatus has: a plurality of pixels having mutually different color filters, and generating pixel signals by a photoelectric conversion; a color selecting switch for selecting the pixel signals generated by the plurality of pixels having mutually different color filters; a first amplifier circuit for amplifying at mutually different gains the pixel signals generated by the pixels having mutually different color filters and selected by the color selecting switch; a reference voltage connecting switch for selecting a reference voltage; and a second amplifier circuit for amplifying at mutually different gains the reference voltages correspondingly to the pixel signals of mutually different colors.

11 Claims, 4 Drawing Sheets

(51) Int. Cl.
*G01J 1/46* (2006.01)
*G01J 3/28* (2006.01)
*G01J 1/04* (2006.01)

(56) References Cited

U.S. PATENT DOCUMENTS

| | | | |
|---|---|---|---|
| 4,742,388 A * | 5/1988 | Cooper et al. | 348/71 |
| 5,099,316 A * | 3/1992 | Ogawa | H04N 9/735 348/228.1 |
| 7,741,593 B2 | 6/2010 | Iwata et al. | 250/214 R |
| 7,817,199 B2 | 10/2010 | Yamashita et al. | 348/308 |
| 8,084,729 B2 | 12/2011 | Kato et al. | 250/208.1 |
| 8,154,639 B2 | 4/2012 | Kato et al. | 348/302 |
| 8,159,582 B2 | 4/2012 | Kato et al. | 348/301 |
| 2002/0063788 A1 * | 5/2002 | Kurashige et al. | 348/273 |
| 2009/0310001 A1 * | 12/2009 | Masuyama et al. | 348/300 |
| 2010/0214461 A1 | 8/2010 | Totsuka | 348/300 |
| 2013/0161487 A1 * | 6/2013 | Sakaguchi et al. | 250/208.1 |
| 2013/0221199 A1 | 8/2013 | Kato | 250/208.1 |

* cited by examiner

PHOTOELECTRIC CONVERSION APPARATUS THAT AMPLIFIES REFERENCE VOLTAGES CORRESPONDING TO PIXEL SIGNALS OF DIFFERENT COLORS AT DIFFERENT GAINS

BACKGROUND OF THE INVENTION

1. Field of the Invention

The present invention relates to a photoelectric conversion apparatus which is used in a scanner, a video camera, a digital camera, or the like.

2. Description of the Related Art

In recent years, there is such a tendency that a high speed is required in a photoelectric conversion apparatus. The method disclosed in the Official Gazette of Japanese Patent Application Laid-Open No. 2010-199710 (Patent Literature 1) is mentioned as one of units for realizing the high speed. According to Patent Literature 1, by using such a circuit construction that pixel signals of the same color are read out in parallel from a plurality of common output lines and color signals of a plurality of colors are read out from each common output line for one horizontal scanning period, a light weight of common output line capacitors is realized, thereby improving speed performance.

According to Patent Literature 1, a point that an amplifier unit is provided for each pixel column and a gain (amplification factor) of the amplifier unit can be switched in accordance with the color has been mentioned. If the gain differs in dependence on the color, noises due to a color selecting switch such as charge injection, clock feed through, or the like are generated, and a difference occurs between levels of the noise contained in the color signals. Thus, when a dark signal is read out, a step shaped signal level difference occurs between the color signals and appears as a stairway-shaped waveform when seen for the whole one horizontal scanning period. Such a distortion of the waveform becomes a factor which causes DSNU (Dark-Signal-Non-Uniformity) to deteriorate.

The invention is made in consideration of the foregoing problems and it is an aspect of the invention to provide a photoelectric conversion apparatus in which the DSNU is small.

SUMMARY OF THE INVENTION

According to an aspect of the invention, a photoelectric conversion apparatus comprises: a plurality of pixels having mutually different color filters, and generating pixel signals by a photoelectric conversion; a color selecting switch configured to select the pixel signals generated by the plurality of pixels having mutually different color filters; a first amplifier circuit configured to amplify at mutually different gains the pixel signals generated by the pixels having mutually different color filters and selected by the color selecting switch; a reference voltage connecting switch configured to select a reference voltage; and a second amplifier circuit configured to amplify at mutually different gains the reference voltages correspondingly to the pixel signals of mutually different colors.

Further features of the present invention will become apparent from the following description of exemplary embodiments with reference to the attached drawings.

DESCRIPTION OF THE EMBODIMENTS

First Embodiment

Figure 1:
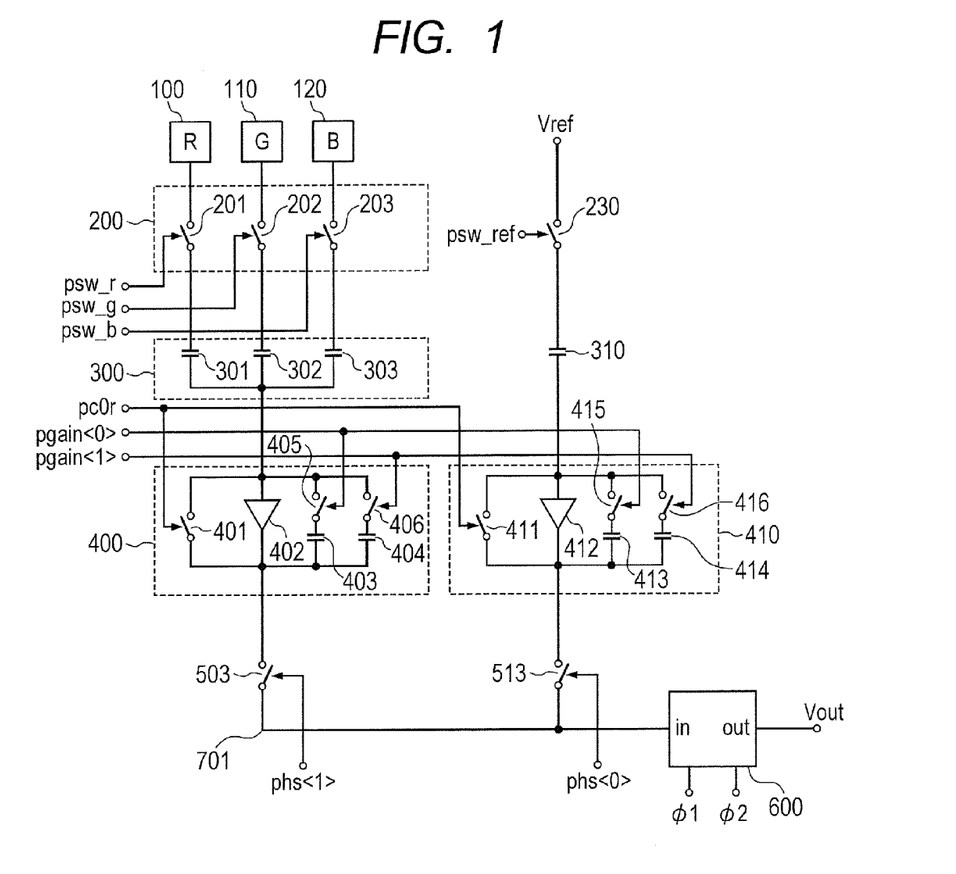
FIG. 1 is a diagram illustrating an example of a construction of a photoelectric conversion apparatus according to the first embodiment of the invention.
Figure 7:
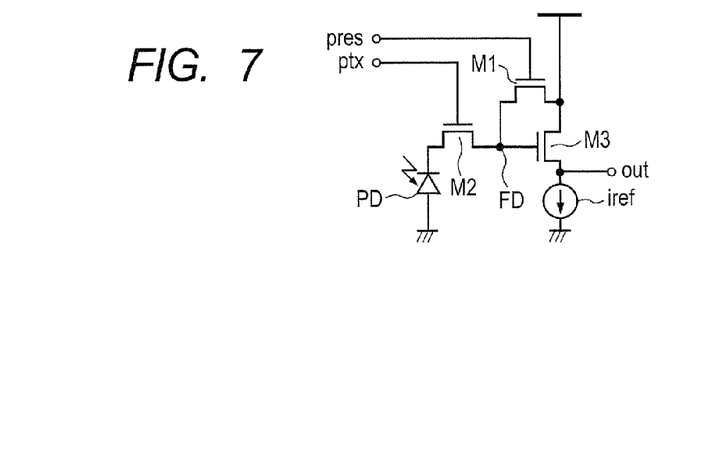
FIG. 7 is a diagram illustrating an example of a construction of a pixel.

FIG. 1 is a diagram illustrating an example of a construction of a photoelectric conversion apparatus according to the first embodiment of the invention. A plurality of pixels 100, 110, and 120 indicate an R pixel, a G pixel, and a B pixel which have different color filters of red (R), green (G), and blue (B) and generate pixel signals by a photoelectric conversion. Each of the R pixel 100, G pixel 110, and B pixel 120 is constructed by a circuit as illustrated in FIG. 7. In FIG. 7, a photodiode PD converts light into electric charges by a photoelectric conversion and accumulates them. By applying a reset pulse pres to a gate of a resetting transistor M1, the resetting operation of the photodiodes PD and floating diffusion FDs in the pixels 100, 110, and 120 is controlled. By applying a transfer pulse ptx to a gate of a transfer transistor M2, the transfer operation of the charges from the photodiodes PD to the floating diffusion FDs is controlled. The floating diffusion FD accumulates the charges. An amplifying transistor M3 is an input unit of a source follower circuit which is made operative by a current source iref for outputting an output according to an electric potential of the floating diffusion FD from a terminal out to circuits at the post stage.

A color selecting switch group 200 is provided. Color selecting switches 201, 202, and 203 are provided to select the pixel signals of the different colors of the R pixel 100, G pixel 110, and B pixel 120, respectively. The color selecting switches 201 to 203 are controlled by control signals psw_r, psw_g, and psw_b, read out the color signals from the pixels 100, 110, and 120, and output to circuits at the post stage, respectively. A reference voltage connecting switch 230 has the same circuit construction as that of each of the color selecting switches 201, 202, and 203 and is provided to select a reference voltage Vref. It is desirable that the reference voltage Vref is set to almost the same voltage value as that of an output voltage at the time of shielding the pixels 100, 110, and 120 against the light.

A color signal input capacitor group 300 is provided. Color signal input capacitors 301, 302, and 303 are provided to sample the color signals which were read out by the color selecting switches 201, 202, and 203, respectively. A reference voltage input capacitor 310 is provided to sample the reference voltage Vref which was read out by the reference voltage connecting switch 230. It is assumed hereinbelow that the color signal input capacitor 301 is set to Cr, the color signal input capacitor 302 is set to Cg, the color signal input capacitor 303 is set to Cb, and the reference voltage input capacitor 310 is set to Cref, respectively. It is also assumed that capacitance values of Cr, Cg, Cb, and Cref are equal.

In each of column amplifier circuits 400 and 410 of a switched capacitor amplifier type, the color signal input capacitor group 300 and the reference voltage input capacitor 310 are used as input capacitors. The column amplifier circuit 400 is a first amplifier circuit for amplifying, at different gains, the pixel signals of the color filters selected by the color selecting switches 201 to 203. The column amplifier circuit 410 is a second amplifier circuit for amplifying the reference voltage Vref selected by the reference voltage connecting switch 230 at a different gain of every color filter. Amplifiers 402 and 412 are provided. Feedback capacitors (403 and 404) and (413 and 414) are provided to decide the gains (amplification factors) of the column amplifier circuits 400 and 410 on the basis of ratios between their capacitance values and Cr, Cg, Cb, or Cref, respectively. It is now assumed that the capacitors 403 and 413 are the first feedback capacitors (hereinbelow, referred to as Cf1, Cf1'), the capacitors 404 and 414 are the second feedback capacitors (hereinbelow, referred to as Cf2, Cf2'), and the capacitance values of Cf1 and Cf1' are larger than those of Cf2 and Cf2' (that is, Cf1>Cf2; Cf1'>Cf2'). Gain control switches (405 and 406) and (415 and 416) are controlled by control signals pgain<0> and pgain<1> and switch the gains by changing total capacitance values of the feedback capacitors of the column amplifier circuits 400 and 410, respectively. A resetting switch 401 is provided to reset signal components accumulated in the capacitor Cf1 or Cf2 by setting a control signal pc0r to the high level and short-circuiting both terminals of the capacitor Cf1 or Cf2. A resetting switch 411 is also provided to reset signal components accumulated in the capacitor Cf1' or Cf2' in a manner similar to that mentioned above.

Figures 3, 4:
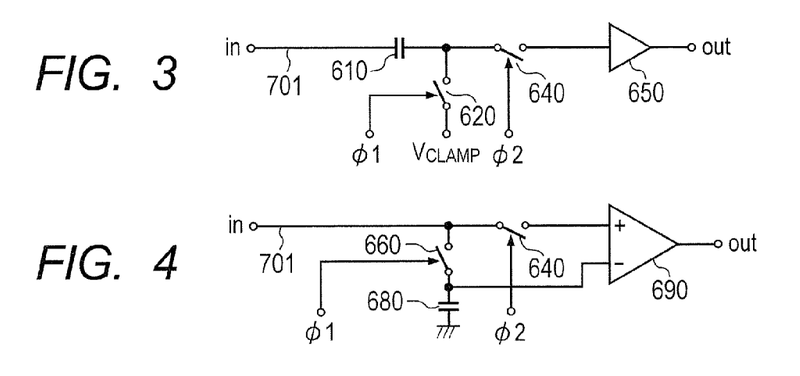
FIG. 3 is a diagram illustrating an example of a construction of a difference detection unit.
FIG. 4 is a diagram illustrating an example of a construction of the difference detection unit.

Horizontal read out switches 503 and 513 are controlled by horizontal scanning pulses phs<0> and phs<1> and are provided to read out output signals of the column amplifier circuits 400 and 410 and output to circuits at the post stage. The horizontal read out switches 503 and 513 are switches for time-divisionally reading out the pixel signals amplified by the column amplifier circuit 400 and the reference voltage amplified by the column amplifier circuit 410 and outputting to a same horizontal common output line 701. The horizontal common output line 701 is provided to transmit the signals read out by the horizontal read out switches 503 and 513 to circuits at the post stage. A difference detector 600 uses the horizontal common output line 701 as an input and detects a difference between the signal based on the reference voltage Vref and the color signal. The difference detector 600 executes a difference process for obtaining a difference between the pixel signals amplified by the column amplifier circuit 400 and the reference voltage amplified by the column amplifier circuit 410. FIG. 3 illustrates an example of a circuit construction of the difference detector 600. A clamping capacitor 610 is provided to execute a clamping process by a clamping switch 620, a clamp voltage VCLAMP, and a control pulse Φ1. An external output control switch 640 is controlled by a control pulse Φ2 and is provided to control timing for outputting the clamped signal to the outside. A buffer circuit 650 is provided to output the signal clamped by the clamping capacitor 610 to the outside.

Although the embodiment has been described with respect to the construction on the assumption that the pixels of each of the color pixels 100, 110, and 120 of R, G, and B is constructed by one pixel for simplicity of explanation, actually, a plurality of pixels are formed in a line with respect to each color. A common amplifier unit and a common output signal line are provided for the different color signals of the respective colors in the sub scanning direction and the color signals are line-sequentially output.

Figure 2:
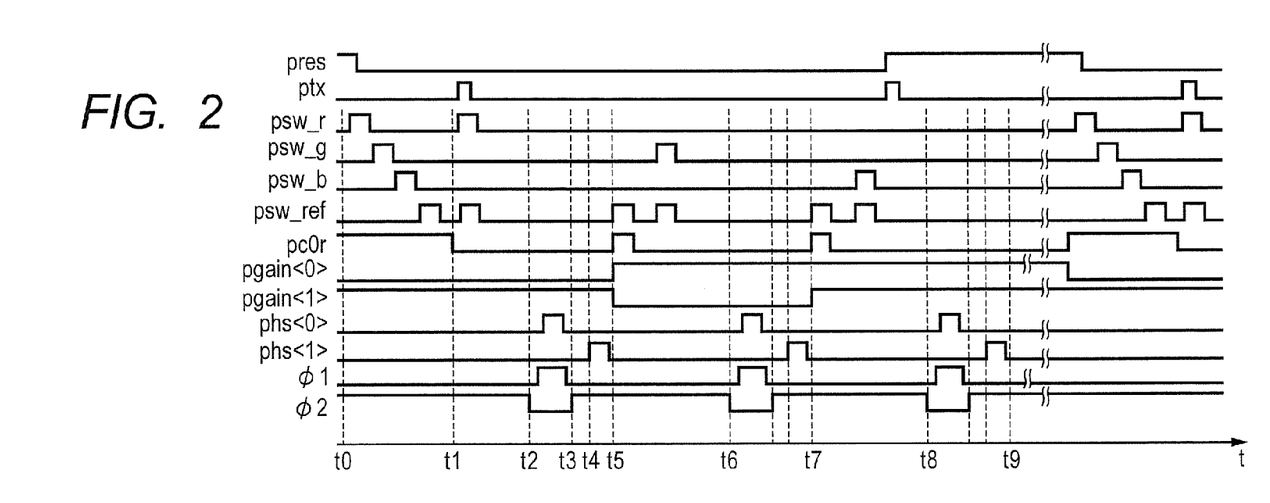
FIG. 2 is a timing chart illustrating an example of processes of the photoelectric conversion apparatus of FIG. 1.

FIG. 2 is a timing chart illustrating an example of processes of the photoelectric conversion apparatus of FIG. 1. The circuit operation in FIG. 1 will be described hereinbelow with reference to FIG. 2. For a period of time from time t0 to t1, the reset signal pres is set to the high level, the resetting transistor M1 is turned on, and the floating diffusion FD is reset to a power voltage. Each of the R pixel 100, G pixel 110, and B pixel 120 outputs the reset signal. Subsequently, the control signals psw_r, psw_g, and psw_b are sequentially set to the high level, the color selecting switches 201 to 203 are sequentially turned on, and the reset signal to the color signal input capacitor group 300 is clamped. At the same time, a resetting process of the column amplifier circuits 400 and 410 is executed by the control signals pc0r, pgain<0>, and pgain<1>. At this time, a control signal psw_ref is set to the high level, the reference voltage connecting switch 230 is turned on, and the reference voltage Vref to the reference voltage input capacitor 310 is also clamped.

After time t1, the transfer pulse ptx is set to the high level, the transfer transistor M2 is turned on, and the charges are transferred from the photodiode PD to the floating diffusion FD. Thus, the color signals according to the charge accumulation time and the incident light are output from the color pixels 100, 110, and 120. For a period of time from time t1 to t2, since the control signal psw_r is set to the high level, the color selecting switch 201 is turned on, and the color signal which is output from the R pixel 100 is input to the color signal input capacitor 301. A difference between the reset signal of the R pixel 100 and the color signal is amplified by the column amplifier circuit 400 and appears as a voltage value to an output of the column amplifier circuit 400. Since the control signal psw_ref is set to the low level from the high level, noises which are generated by the reference voltage connecting switch 230 due to the charge injection or clock feed through are amplified by the column amplifier circuit 410 and appear as a voltage value to an output of the column amplifier circuit 410. At this time, since the control signal pgain<0> is at the low level and the control signal pgain<1> is at the high level, feedback capacitances of the column amplifier circuits 400 and 410 are equal to Cf2 and the gain is determined by ratios between the capacitances Cf2 and Cr and Cref.

At this time, the noises generated by the color selecting switch 201 are contained in the output voltage of the column amplifier circuit 400 together with the color signal component of the R pixel 100. The noises generated by the color selecting switch 201 are the noise component caused by the charge injection or clock feed through in a manner similar to the noises generated by the reference voltage connecting switch 230. Since the gains of the column amplifier circuits 400 and 410 coincide, the noises generated by the color selecting switch 201 appear to the output of the column amplifier circuit 400 as a magnitude that is almost equal to that of the noises which are generated by the reference voltage connecting switch 230 and are contained in the output of the column amplifier circuit 410. The column amplifier circuit 410 amplifies the reference voltage Vref at the same gain as that of the pixel signal of each color filter of the column amplifier circuit 400.

For a period of time from time t2 to t3, after the control pulse Φ2 was set to the low level, when the control pulse Φ1 is set to the high level and the horizontal scanning pulse phs<0> is set to the high level, the horizontal read out switch 513 is turned on. Thus, the read-out of the output of the column amplifier circuit 410 is started and the signal based on the reference voltage Vref from the column amplifier circuit 410 is held in the clamping capacitor 610 (FIG. 3).

For a period of time from time t4 to t5, when the horizontal scanning pulse phs<1> is set to the high level, the horizontal read out switch 503 is turned on. Thus, the color signal of the R pixel 100 from the column amplifier circuit 400 is input to the difference detector 600. A difference between the signal based on the reference voltage Vref and the color signal of the R pixel 100 is output to the outside through the buffer circuit 650 (FIG. 3). At this time, since the gains of the column amplifier circuits 400 and 410 are equal, the noises generated by the reference voltage connecting switch 230 and the color selecting switch 201 are contained in the signal based on the reference voltage Vref and the color signal of the R pixel 100, respectively. Those noises have a correlation between the circuit constructions after the color selecting switch 201 and the reference voltage connecting switch 230 and their operations. By executing the difference process by the difference detector 600, those noises are set off and reduced. Therefore, the color signal of the R pixel 100 in a state where the noises generated by the color selecting switch 201 were reduced is output to an output terminal Vout.

Subsequently, at time t5, the read-out of the color signal of the R pixel 100 is finished and a read out process of the color signal of the G pixel 110 is started. For a period of time from time t5 to t6, the operation similar to the operation of the color signal of the R pixel 100 which is executed for the period of time from time t1 to t2 is applied to the G pixel 110 except for a point that the resetting operations of the column amplifier circuits 400 and 410 by the control signal psw_ref and pc0r are added. That is, the control signals psw_g and psw_ref are set to the high level, the color selecting switch 202 and the reference voltage connecting switch 230 are turned on, and the color signal of the G pixel 110 is input to the color signal input capacitor 302. Since the color signal pgain<0> is set to the high level and the color signal pgain<1> is set to the low level at time t5, the gains of the column amplifier circuits 400 and 410 are determined by the ratios between the capacitances Cf1 and Cg and Cref.

Since Cf1>Cf2 and the feedback capacitances increased, the gain of the color signal of the G pixel 110 is lower than that of the color signal of the R pixel 100. Thus, the noises which are generated by the color selecting switch 202 and the reference voltage connecting switch 230 and appear in the outputs of the column amplifier circuits 400 and 410 are smaller than the noises which are generated at the time of read out of the R pixel 100.

For a period of time from time t6 to t7, the operation similar to the operation which was executed to the color signal of the R pixel 100 for the period of time from time t2 to t5 is also executed to the color signal of the G pixel 110. At this time, the signal based on the reference voltage Vref and the color signal of the G pixel 110 which are used in the clamping process are the signals which were read out at the same gain. Therefore, the noises which were generated by the reference voltage connecting switch 230 and are contained in the signal based on the reference voltage Vref have a magnitude similar to that of the noises which were generated by the color selecting switch 202 and are contained in the color signal of the G pixel 110.

Therefore, by executing the difference process by the difference detector 600, the noises generated by the color selecting switch 202 can be reduced. Thus, a difference between the color signal of the R pixel 100 in a dark state and the color signal of the G pixel 110 decreases.

Subsequently, the operation similar to the operation which was executed to the color signal of the G pixel 110 for the period of time from time t5 to t6 is also executed to the color signal of the B pixel 120 for the period of time from time t7 to t8. That is, the control signals psw_b and psw_ref are set to the high level, the color selecting switch 203 and the reference voltage connecting switch 230 are turned on, and the color signal of the B pixel 120 is input to the color signal input capacitor 303. At this time, when both of the control signals pgain<0> and pgain<1> are set to the high level at time t7, the feedback capacitances of the column amplifier circuits 400 and 410 are equal to (cf1+cf2). Since the feedback capacitances increase more than those at the time of read out of the color signals of the R pixel 100 and the G pixel 110, the gains of the column amplifier circuits 400 and 410 decrease. Thus, the noises which are generated by the color selecting switch 203 and the reference voltage connecting switch 230 and appear in the outputs of the column amplifier circuits 400 and 410 with respect to the B pixel 120 are smaller than the noises which are generated at the time of the R pixel 100 and the G pixel 110.

For a period of time from time t8 to t9, the operation similar to the operation which was executed to the color signal of the G pixel 110 for the period of time from time t6 to t7 is also executed to the color signal of the B pixel 120. At this time, the signal based on the reference voltage Vref and the color signal of the B pixel 120 which are used in the clamping process are the signals which were read out at the same gain. Therefore, the noises which were generated by the reference voltage connecting switch 230 and are contained in the signal based on the reference voltage Vref have a magnitude similar to that of the noises which were generated by the color selecting switch 203 and are contained in the color signal of the B pixel 120.

Therefore, by executing the difference process by the difference detector 600, the noises generated by the color selecting switch 203 can be reduced. Thus, a difference between the color signal of the B pixel 120 in the dark state and the color signal of the G pixel 110 and a difference between the color signal of the B pixel 120 in the dark state and the color signal of the G pixel 110 decrease.

The read out of the signals is completed at time t9. At this time, it is assumed that a period of time from time t2 to t9 is set to one horizontal scanning period and charge accumulation periods of the color signals of the R pixel 100, G pixel 110, and B pixel 120 which are output from the output terminal Vout for one horizontal scanning period coincide.

The color signals of the coincident gain of the column amplifier circuits 400 and 410 and the reference voltage Vref are output during the same horizontal scanning period and differences between the color signals of the coincident gain and the signal based on the reference voltage Vref are obtained by the difference detector 600. Therefore, the noises which are generated by the reference voltage connecting switch group 200 can be reduced. Thus, a difference between the signal levels due to the colors which are typically seen because the gains of the column amplifier circuits 400 and 410 differ every color irrespective of the dark state can be reduced. When the dark signal is obtained, characteristics in which the DSNU was decreased can be obtained.

The invention has been described above with respect to the embodiment in which the pixels of each color are constructed by one pixel. Timing in the case of reading out a plurality of line-shaped pixel signals will be simply described hereinbelow. In FIG. 2, with respect to the signal amplified by the amplifier 402, the horizontal scanning pulses phs<1> is set to the high level for the period of time from time t4 to t5 as for the signal of the R pixel 100, it is set to the high level for the period of time before time t7 as for the signal of the G pixel 110, and it is set to the high level for the period of time before time t9 as for the signal of the B pixel 120. Therefore, the horizontal read out switch 503 is turned on and the signals are sequentially output to the horizontal common output line 701.

If the difference process is executed by using the signal based on the common reference voltage Vref to a plurality of same color signals, since it is sufficient to read out the reference voltage Vref once to the line-shaped pixel signals, a read out time can be shortened. Or, the reference voltage Vref may be read out every pixel signal or every plural signals.

Although the embodiment has been described with respect to the case where the pixels of the three colors of R, G, and B were applied, the invention is not limited to such a case. For example, a monochromatic pixel without a color filter may be provided in addition to the pixels of the three colors of R, G, and B. This is true of the following embodiments.

Although the embodiment has been described with respect to such a circuit construction that the gains of the column amplifier circuits 400 and 410 of the color signal and the reference voltage Vref are equal, the invention is not limited to such a case. It is also possible to use such a circuit construction and setting that the gains of the column amplifier circuits 400 and 410 of the color signal and the reference voltage Vref are close to each other to such an extent that the DSNU performance which is required can be satisfied. At this time, it is assumed that magnitude relations between the gains of the column amplifier circuits 400 and 410 of the color signal and the reference voltage Vref coincide. For example, when the gain of the R pixel 100 is larger than the gains of the G pixel 110 and the B pixel 120, the following processes are executed. That is, it is assumed that the gain of the reference voltage Vref in which the CDS (correlation double sampling) process is executed to the color signal of the R pixel 100 is also larger than the gain of each reference voltage Vref in which the CDS process is executed to the color signals of the G pixel 110 and the B pixel 120. Therefore, if the gain of the reference voltage Vref can satisfy the DSNU performance, it is not always necessary that it is equal to the gain of the R pixel 100. This is true of the following embodiments.

Although the noises which are generated by the color selecting switches 201 to 203 have been reduced by using the reference voltage Vref in the embodiment, the invention is not limited to such a case. For example, an output signal from an OB pixel (optical black pixel) in which a photosensing portion has been shielded against the light by a metal layer or the like may be used as a reference voltage Vref or a reset potential of the pixel may be used as a reference voltage Vref. That is, the reference voltage Vref may be produced by the light-shielded optical black pixel.

The difference detector 600 in the embodiment is not limited to the circuit construction illustrated in FIG. 3 but, for example, a circuit construction as illustrated in FIG. 4 may be used. The difference detector 600 in FIG. 4 is constructed by: a reference voltage holding capacitor 680 to hold the reference voltage; a reference voltage S/H switch 660 for controlling the sampling to the reference voltage holding capacitor 680; and a differential amplifier 690. The timing chart of FIG. 2 can be applied to the difference detector 600 in FIG. 4. Even if the difference detector 600 is provided in the outside of a chip, the effect by the embodiment can be similarly obtained.

Second Embodiment

Figure 5:
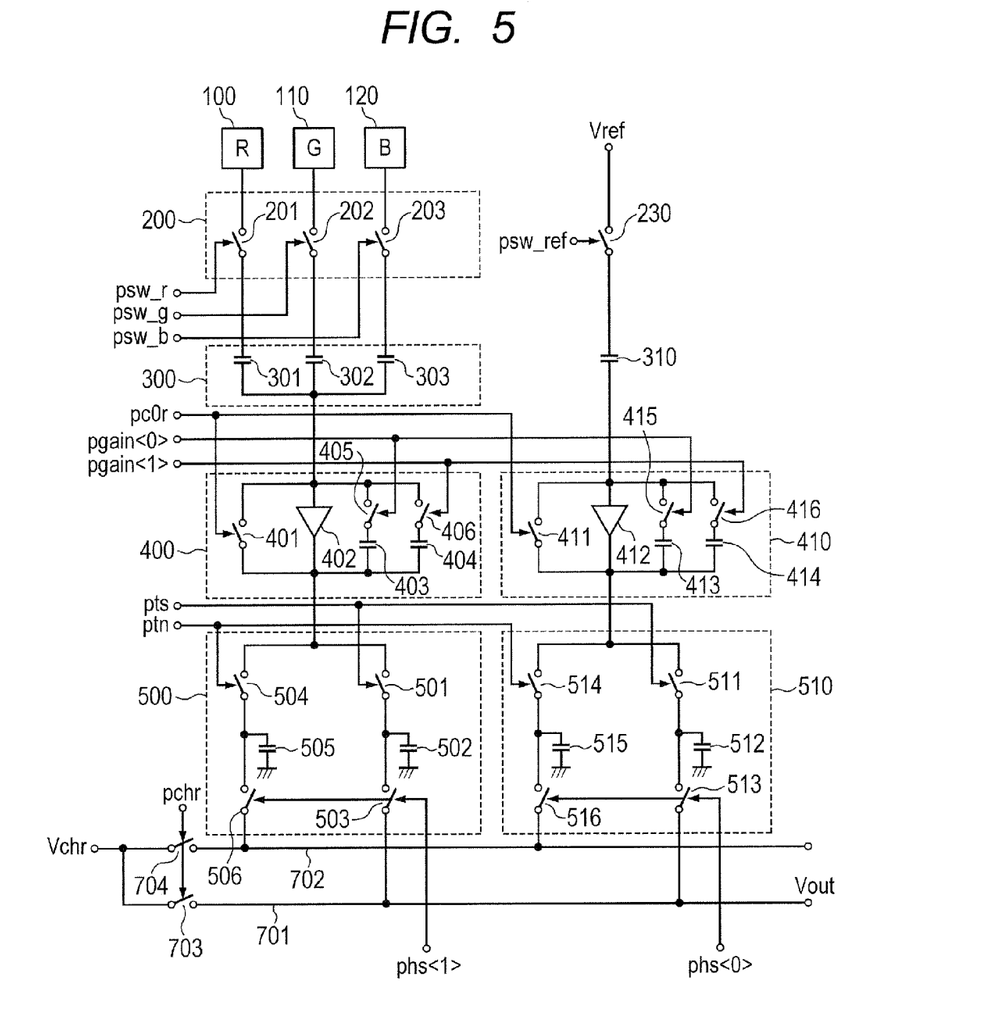
FIG. 5 is a diagram illustrating an example of a construction of a photoelectric conversion apparatus according to the second embodiment of the invention.
Figure 6:
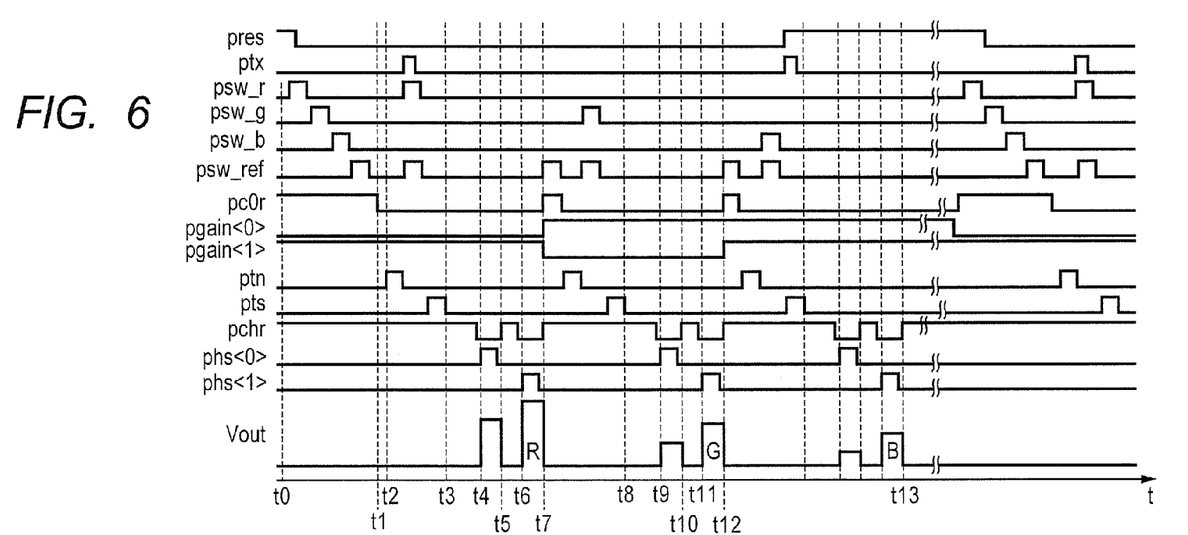
FIG. 6 is a timing chart illustrating an example of processes of the photoelectric conversion apparatus of FIG. 5.

FIG. 5 is a diagram illustrating an example of a construction of a photoelectric conversion apparatus according to the second embodiment of the invention. FIG. 6 is a timing chart illustrating an example of processes of the photoelectric conversion apparatus of FIG. 5. According to the embodiment, a variation in offset voltage between the amplifiers at the time when the column amplifier circuits 400 and 410 are initialized is reduced. The second embodiment will now be described hereinbelow with respect to a point different from the first embodiment.

A circuit in FIG. 5 will now be described with respect to a point different from the circuit in FIG. 1. In FIG. 5, the output signals of the column amplifier circuits 400 and 410 are held in line memories 500 and 510 until the horizontal scanning period. Color signal sampling/holding control switches 501 and 511 are controlled by a control pulse pts. Second capacitors 502 and 512 are color signal sampling capacitors for holding the color signals amplified by the column amplifier circuits 400 and 410 and the signal based on the reference voltage Vref. The second capacitors 502 and 512 in the line memories 500 and 510 are the capacitors for holding the color signals amplified by the column amplifier circuits 400 and 410 and the reference voltage. Hereinbelow, the capacitors 502 and 512 are assumed to be Cts and Cts'. Offset voltage sampling/holding control switches 504 and 514 are controlled by a control pulse ptn. First capacitors 505 and 515 are offset voltage sampling capacitors for holding the offset voltages of the column amplifier circuits 400 and 410. The first capacitor 505 in the line memory 500 is a capacitor to hold the offset voltage at the time of initialization of the column amplifier circuit 400. Hereinbelow, the capacitor 505 is assumed to be Ctn. Horizontal read out switches 506 and 516 are controlled by the horizontal scanning pulses phs<0> and phs<1> and are provided to transmit the offset voltage held in the capacitor Ctn to a horizontal common output line 702. The horizontal read out switches (506 and 503) and (513 and 516) are used to read out the offset voltage held in the first capacitor Ctn and the pixel signal held in the second capacitor Cts to the different horizontal common output lines 702 and 701 by the horizontal scanning pulses phs<0> and phs<1>, respectively. Horizontal common output line resetting switches 703 and 704 are controlled by a control pulse pchr and are provided to reset the horizontal common output lines 701 and 702 to a reset voltage Vchr.

The timing chart of FIG. 6 will be described hereinbelow with respect to a point different from the timing chart of FIG. 2. In FIG. 6, as shown in a period of time from time t2 to t3, when the control pulses ptn and pts are set to the high level, the switches 504 and 501 are turned on. Thus, the color signal of the R pixel 100 and the signal based on the reference voltage Vref as output signals from the column amplifier circuits 400 and 410 are temporarily held in the capacitors 505 and 502. After that, for a period of time from time t4 to t7, when the horizontal scanning pulses phs<0> and phs<1> are set to the high level, the horizontal read out switches 503 and 506 are turned on and the signals held in the capacitors 502 and 505 are sequentially transmitted to the horizontal common output lines 701 and 702. At this time, in a manner similar to the first embodiment, by obtaining a difference between the signal components held in the capacitors Cts and Ctn of the line memories 500 and 510 which are simultaneously output, the offset-based noises which are generated by the column amplifier circuits 400 and 410 can be reduced. The color signals of the G pixel 110 and the B pixel 120 are also read out by the operation similar to that for the R pixel 100.

Although the embodiment has been described with respect to the construction in which the difference process between the signal based on the reference voltage Vref and each color signal is executed in the outside of the chip, it is also possible to use such a construction that a circuit for executing the difference process like a process that is executed in the difference detector 600 in FIG. 1 as mentioned above is built in the chip.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-118870, filed on May 24, 2012, which is hereby incorporated by reference herein in its entirety.

What is claimed is:

1. A photoelectric conversion apparatus comprising:
a plurality of pixels each generating pixel signals by a photoelectric conversion, and including a first pixel and a second pixel, the first pixel having a first color filter of a first color, the second pixel having a second color filter of a second color different from the first color;
a first amplifier circuit configured to input the pixel signal of the first pixel and the pixel signal of the second pixel, amplify the pixel signal of the first pixel at a first gain, and amplify the pixel signal of the second pixel at a second gain different from the first gain; and
a second amplifier circuit configured to input a reference signal, amplify the reference signal at a third gain in correspondence with the pixel signal of the first pixel inputted to the first amplifier circuit, and amplify the reference signal at a fourth gain in correspondence with the pixel signal of the second pixel inputted to the first amplifier circuit.

2. The photoelectric conversion apparatus according to claim 1, wherein the first gain and the third gain are same, and the second gain and the fourth gain are same.

3. The photoelectric conversion apparatus according to claim 2, further comprising a difference detector configured to perform a difference processing between the pixel signal amplified by the first amplifier circuit at the first gain, and the reference signal amplified by the second amplifier circuit at the third gain, and a difference processing between the pixel signal amplified by the first amplifier circuit at the second gain, and the reference signal amplified by the second amplifier circuit at the fourth gain.

4. The photoelectric conversion apparatus according to claim 3, further comprising a read out switch configured to read out the pixel signal amplified by the first amplifier circuit and the reference signal amplified by the second amplifier circuit in a time division manner to the same output line.

5. The photoelectric conversion apparatus according to claim 3, wherein the reference signal is generated by an optical black pixel shielded from light.

6. The photoelectric conversion apparatus according to claim 2, wherein the reference signal is generated by an optical black pixel shielded from light.

7. The photoelectric conversion apparatus according to claim 1, further comprising a difference detector configured to perform a difference processing between the pixel signal amplified by the first amplifier circuit and the reference signal amplified by the second amplifier circuit.

8. The photoelectric conversion apparatus according to claim 1, further comprising a read out switch configured to read out the pixel signal amplified by the first amplifier circuit and the reference signal amplified by the second amplifier circuit in a time division manner to the same output line.

9. The photoelectric conversion apparatus according to claim 1, further comprising;
a first capacitor configured to hold an offset signal corresponding to initialization of the first amplifier circuit, and
a second capacitor configured to hold the pixel signal amplified by the first amplifier circuit.

10. The photoelectric conversion apparatus according to claim 9, further comprising a read out switch configured to read out, to the different output lines, the offset signal held by the first capacitor and the pixel signal held by the second capacitor.

11. The photoelectric conversion apparatus according to claim 1, wherein the reference signal is generated by an optical black pixel shielded from light.

* * * * *